(12) United States Patent
Shero et al.

(10) Patent No.: US 10,556,799 B2
(45) Date of Patent: *Feb. 11, 2020

(54) TRITERTBUTYL ALUMINUM REACTANTS FOR VAPOR DEPOSITION

(71) Applicant: ASM IP HOLDING B.V., Almere (NL)

(72) Inventors: Eric J. Shero, Phoenix, AZ (US); Mohith E. Verghese, Phoenix, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,524

(22) Filed: Jul. 30, 2018

(65) Prior Publication Data

US 2018/0339907 A1 Nov. 29, 2018

Related U.S. Application Data

(63) Continuation of application No. 15/239,389, filed on Aug. 17, 2016, now Pat. No. 10,118,828.

(60) Provisional application No. 62/236,752, filed on Oct. 2, 2015.

(51) Int. Cl.
| | |
|---|---|
| *C01B 32/921* | (2017.01) |
| *C23C 16/32* | (2006.01) |
| *C23C 16/455* | (2006.01) |
| *C23C 16/18* | (2006.01) |

(52) U.S. Cl.
CPC ............ *C01B 32/921* (2017.08); *C23C 16/32* (2013.01); *C23C 16/45525* (2013.01)

(58) Field of Classification Search
None
See application file for complete search history.

(56) References Cited

U.S. PATENT DOCUMENTS

| | | | |
|---|---|---|---|
| 5,863,836 A | 1/1999 | Jones | |
| 9,916,980 B1 | 3/2018 | Knaepen et al. | |
| 10,002,936 B2 | 6/2018 | Haukka et al. | |
| 10,118,828 B2 * | 11/2018 | Shero | ................ C23C 16/45525 |
| 10,121,699 B2 * | 11/2018 | Wang | ................ H01L 21/02274 |
| 2005/0003662 A1 | 1/2005 | Jursich et al. | |
| 2007/0237697 A1 | 10/2007 | Clark | |
| 2010/0102417 A1 | 4/2010 | Ganguli et al. | |
| 2011/0263115 A1 | 10/2011 | Ganguli et al. | |
| 2016/0118261 A1 | 4/2016 | Haukka et al. | |
| 2016/0376700 A1 | 12/2016 | Haukka et al. | |
| 2016/0376704 A1 | 12/2016 | Raisanen et al. | |
| 2017/0040164 A1 | 2/2017 | Wang et al. | |
| 2017/0096345 A1 | 4/2017 | Shero et al. | |
| 2019/0043962 A1 * | 2/2019 | Haukka | ............... H01L 29/4966 |

OTHER PUBLICATIONS

Office Action, dated Nov. 20, 2019, in Taiwanese Patent Application No. 105129014.

* cited by examiner

*Primary Examiner* — Helene Klemanski

(74) *Attorney, Agent, or Firm* — Knobbe, Martens, Olson & Bear, LLP

(57) ABSTRACT

Aluminum (Al) hydrocarbon precursor compositions are provided that can be used for vapor deposition of transition metal carbide thin films, for example aluminum-doped transition metal carbide thin films such as Al-doped titanium carbide thin films. In some embodiments, the precursor compositions comprise one or more isomers of tritertbutyl aluminum (TTBA). In some embodiments the precursor compositions comprise at least 50% of Isomer 1 of TTBA, at least 50% of Isomer 2 of TTBA, or at least 20% of a combination of Isomer 1 and Isomer 2, where Isomer 1 has the formula Al(tert-Bu)$_2$(iso-Bu) and Isomer 2 has the formula Al(tert-Bu)(iso-Bu)$_2$. A container containing a precursor composition comprising at least 50% of Isomer 1 or Isomer 2 or at least 20% of a combination of Isomer 1 and 2 of TTBA can be attached to a vapor deposition reactor and used to deposit transition metal carbide thin films such as Al-doped titanium carbide thin films by atomic layer deposition or chemical vapor deposition.

10 Claims, 1 Drawing Sheet

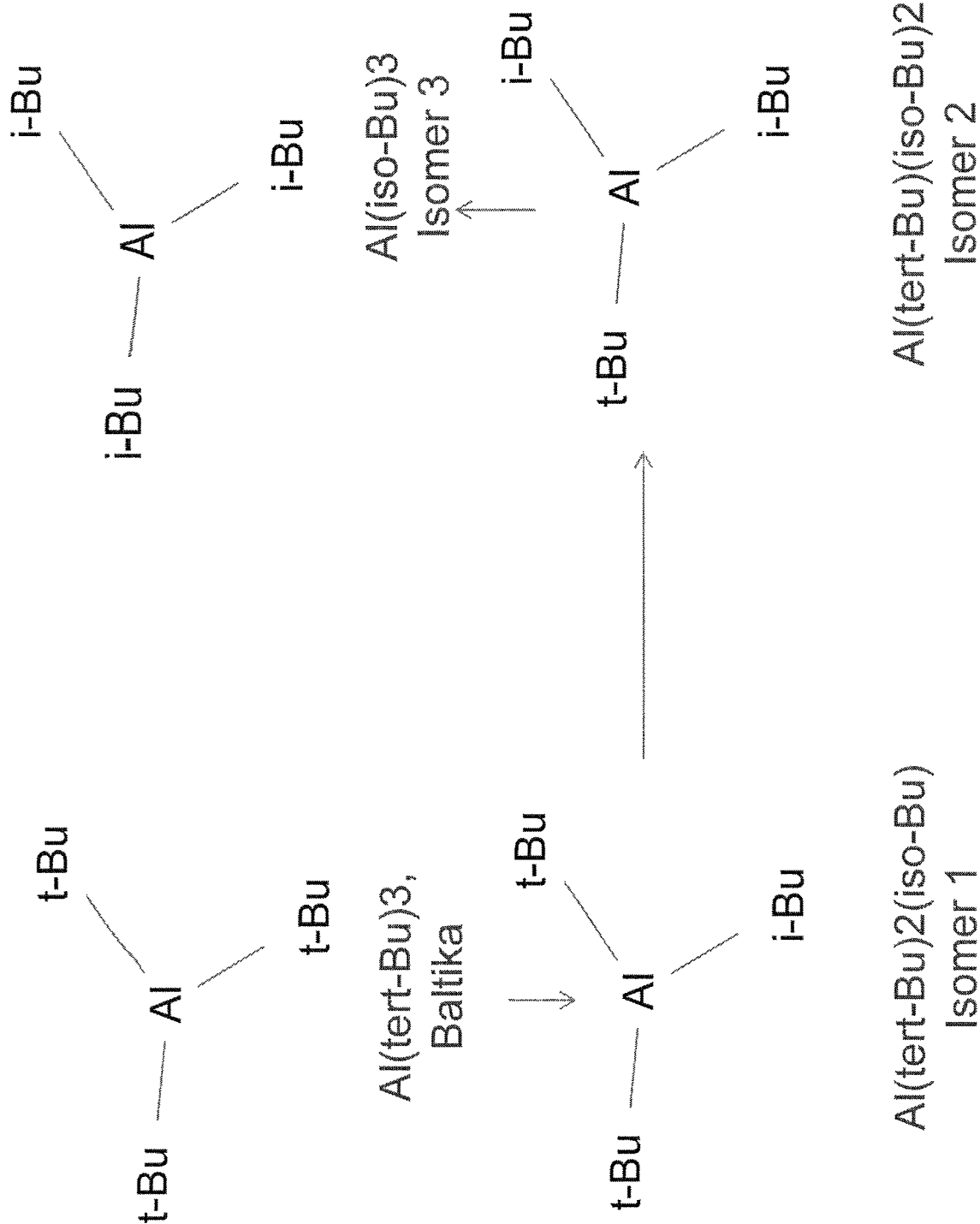

TRITERTBUTYL ALUMINUM REACTANTS FOR VAPOR DEPOSITION

PRIORITY AND CROSS-REFERENCE TO RELATED APPLICATIONS

This application is a Continuation Application of U.S. application Ser. No. 15/239,389, filed Aug. 17, 2016 and published as US 2017/0096345 A1 on Apr. 6, 2017, now U.S. Pat. No. 10,118,828, which claims the benefit of U.S. Provisional Application 62/236,752 filed on Oct. 2, 2015. All applications for which priority is claimed are identified in the Application Data Sheet filed herewith and are hereby incorporated by reference in their entirety under 37 C.F.R. § 1.57.

BACKGROUND

Field of the Invention

The present application relates generally to reactants comprising isomers of tritertbutyl aluminum (TTBA) and their use in vapor deposition processes, such as in the deposition of transition metal carbide thin films, for example aluminum-doped titanium carbide thin films.

Description of the Related Art

Metal carbides, such as titanium carbides, have found use in various applications in the electronics industry, from gate electrodes to diffusion barriers. Metal carbide thin films have been formed by various methods including chemical vapor deposition (CVD), physical vapor deposition (PVD) and atomic layer deposition (ALD).

Metal halide reactants have been used in combination with aluminum precursors such as trimethyl aluminum (TMA) and triethyl aluminum (TEA) to deposit metal carbide thin films.

SUMMARY

In some embodiments, methods of depositing aluminum-doped transition metal carbide thin films on a substrate in a reaction space are provided. The methods may comprise contacting the substrate with a first vapor phase reactant formed by vaporizing a first precursor composition comprising Isomer 1 and/or Isomer 2 of tritertbutyl aluminum (TTBA), wherein the Isomer 1 has a formula $Al(tert-Bu)_2(iso-Bu)$ and the Isomer 2 has a formula $Al(tert-Bu)(iso-Bu)_2$, and a second vapor phase reactant formed by vaporizing a second precursor comprising a transition metal halide.

In some embodiments, the method is a chemical vapor deposition process. In some embodiments, the method is an atomic layer deposition process.

In some embodiments, methods comprise at least one deposition cycle in which the substrate is alternately and sequentially contacted with the first vapor phase reactant comprising TTBA Isomer 1 and/or Isomer 2 and a second vapor phase transition metal halide reactant. In some embodiments, the deposition cycle is repeated two or more times.

In some embodiments, the methods comprise contacting the substrate with a vapor phase titanium precursor, wherein the titanium precursor comprises a titanium halide, for example, $TiCl_4$.

In some embodiments, the first precursor composition comprises at least 50% Isomer 1. In some embodiments, the first precursor composition comprises at least 80% Isomer 1. In some embodiments, the first precursor composition comprises at least 90% Isomer 1.

In some embodiments, the first precursor composition comprises at least 50% Isomer 2. In some embodiments, the first precursor composition comprises at least 80% Isomer 2. In some embodiments, the first precursor composition comprises at least 90% Isomer 2.

In some embodiments the first precursor composition comprises both Isomer 1 and Isomer 2. In some embodiments, the first precursor composition comprises at least 20% of a combination of Isomer 1 and Isomer 2. That is, the percentage of Isomer 1 in the composition plus the percentage of Isomer 2 in the composition is greater than 20%. In some embodiments, the first precursor composition comprises at least 50% of a combination of Isomer 1 and Isomer 2. That is, the percentage of Isomer 1 in the composition plus the percentage of Isomer 2 in the composition is greater than 50%. In other embodiments, the first precursor composition comprises at least 80% of a combination of Isomer 1 and Isomer 2. That is, the percentage of Isomer 1 in the composition plus the percentage of Isomer 2 in the composition is greater than 80%.

In some embodiments, the first precursor composition does not comprise TTBA or Isomer 3. In some embodiments, the first precursor composition may comprise small or trace quantities of Isomer 3. For example, in some embodiments the first precursor composition may comprise at most 5% Isomer 3. In some embodiment, the first precursor composition may comprise small or trace quantities of TTBA. For example, in some embodiments the first precursor composition may comprise at most 5% TTBA. In some embodiments the first precursor composition may comprise small or trace quantities of both TTBA and Isomer 3, such as up to at most 5% of each.

In some embodiments, a vapor deposition precursor composition comprising greater than 50% Isomer 1, greater than 50% Isomer 2, or greater than 20% of a combination of Isomer 1 and 2 of $Al(tert-Bu)_3$ is provided, wherein Isomer 1 has the formula $Al(tert-Bu)_2(iso-Bu)$ and Isomer 2 has the formula $Al(tert-Bu)(iso-Bu)_2$. In some embodiments, the composition comprises greater than 70% Isomer 1. In some embodiments, the composition comprises greater than 80% Isomer 1. In some embodiments, the composition comprises greater than 70% Isomer 2. In some embodiments, the composition comprises greater than 80% Isomer 2. In some embodiments, the composition additionally comprises $Al(tert-Bu)_3$. In some embodiments, the composition additionally comprises Isomer 3 of $Al(tert-Bu)_3$, wherein Isomer 3 has the formula $Al(iso-Bu)_3$.

In some embodiments, the vapor deposition precursor composition comprises at least 20% of Isomer 1 and Isomer 2 taken together. In some embodiments, the vapor deposition precursor composition comprises at least 50% of Isomer 1 and Isomer 2 taken together. In some embodiments, the vapor deposition precursor composition comprises at least 80% of Isomer 1 and Isomer 2 taken together. In some embodiments, the vapor deposition precursor composition comprises Isomer 1 and Isomer 2 and does not comprise Isomer 3. In some embodiments, the vapor deposition precursor composition comprises Isomer 1 and Isomer 2 and at most 5% Isomer 3

In some embodiments, a container configured to be attached to a deposition reactor is provided, with the container containing a composition comprising at least 50%

Isomer 1 or at least 50% Isomer 2 of Al(tert-Bu)$_3$, wherein Isomer 1 has the formula Al(tert-Bu)$_2$(iso-Bu) and Isomer 2 has the formula Al(tert-Bu)(iso-Bu)$_2$. In some embodiments, the composition comprises greater than 70% Isomer 1. In some embodiments, the composition comprises greater than 80% Isomer 1. In some embodiments, the composition comprises greater than 70% Isomer 2. In some embodiments, the composition comprises greater than 80% Isomer 2. In some embodiments, the composition additionally comprises Al(tert-Bu)$_3$. In some embodiments, the composition additionally comprises Isomer 3 of Al(tert-Bu)$_3$, wherein Isomer 3 has the formula Al(iso-Bu)$_3$.

In some embodiments, a container configured to be attached to a deposition reactor is provided, with the container containing a composition comprising at least 20% of a combination of Isomer 1 and Isomer 2. In some embodiments, the composition comprises at least 50% of a combination of Isomer 1 and Isomer 2. In some embodiments, the composition comprises at least 80% of a combination of Isomer 1 and Isomer 2. In some embodiments, the composition comprises a combination of Isomer 1 and Isomer 2 and does not comprise Isomer 3. In some embodiments, the composition comprises a combination of Isomer 1 and Isomer 2 and at most 5% Isomer 3

In some embodiments, a deposition reactor is provided comprising a first reactant container fluidly connected to a reaction chamber, the reactant container comprising a first precursor composition comprising at least 50% of an isomer of Al(tert-Bu)$_3$, wherein the isomer of Al(tert-Bu)$_3$ is Isomer 1 of formula Al(tert-Bu)$_2$(iso-Bu) or Isomer 2 of formula Al(tert-Bu)(iso-Bu)$_2$. In some embodiments, the first reactant container comprises a precursor composition comprising at least 20% of a combination of Isomer 1 and Isomer 2. In some embodiments, the first reactant container comprises a precursor composition comprising at least 50% of a combination of Isomer 1 and Isomer 2. In some embodiments, the first reactant container comprises a precursor composition comprising at least 80% of a combination of Isomer 1 and Isomer 2. In some embodiments, the reactant container does not comprise Isomer 3. In some embodiments, the reactant container may comprise at most 5% Isomer 3. In some embodiments the reactant container does not comprise TTBA. In some embodiments, the reactant container may comprise at most 5% TTBA.

In some embodiments, the deposition reactor is configured to vaporize the first precursor composition and conduct the vapor to the reaction chamber.

In some embodiments, the deposition reactor comprises a second reactant container, the second container comprising a transition metal halide precursor composition such as a titanium halide precursor composition.

BRIEF DESCRIPTION OF THE DRAWINGS

The FIGURE shows the isomerization of tritertbutyl aluminum (TTBA) into Isomer 1, Isomer 2 and Isomer 3.

DETAILED DESCRIPTION

Transition metal carbide thin films, such as titanium carbide (TiC) thin films and aluminum-doped transition metal carbide thin films such as titanium aluminum carbide (TiAlC) thin films can be used in a variety of contexts, including metal gate and gate electrode applications in metal oxide semiconductor field effect transistors (MOSFETs), such as n-channel MOSFETs (NMOS). Transition metal carbide thin films and aluminum-doped transition metal carbide thin films, such as TiC and TiAlC thin films, with desirable properties can be formed by employing aluminum hydrocarbon compounds to carburize a metal (e.g., titanium (Ti)) reactant on a substrate. While such films have been deposited by vapor deposition using titanium halide precursors in combination with aluminum reactants such as trimethyl aluminum (TMA) and triethyl aluminum (TEA), it has been found that films deposited using aluminum reactants that do not comprise beta hydrogens can have improved properties. Transition metal carbide thin films and aluminum-doped transition metal carbide thin films, such as Al-doped TiC thin films, can be deposited using tritertbutyl aluminum (TTBA) precursor compositions. These reactants can be used to produce thin films with improved properties, such as lower resistivity and/or lower work function, relative to films deposited using a titanium halide and TMA or TEA.

However, TTBA has been found to be susceptible to isomerization over time, such as under typical storage conditions. This isomerization can lead to variability in the quality of the films deposited using the TTBA reactant. This variability can be controlled by utilizing TTBA compositions that comprise one or more of the three TTBA isomers. Thus, as discussed in more detail below, in some embodiments TTBA compositions comprising one or more TTBA isomers are provided. As discussed below, in some embodiments the TTBA compositions may comprise one or more isomers of TTBA but not TTBA itself. The TTBA compositions can be used as reactants in vapor deposition processes, such as in ALD and CVD processes for depositing transition metal carbide thin films, and in particular Al-doped transition metal carbide thin films such as Al-doped TiC thin films.

Using the methods and compositions described herein, transition metal carbide thin films with an increased aluminum content and/or desirable characteristics such as low resistivity can be formed on a substrate. A substrate in a reaction space is contacted with a vapor phase titanium source chemical, such as a titanium halide, and a reactant comprising one or more TTBA isomers as described below. The films preferably have good adhesion, low resistivity and good oxidation resistance. The reaction conditions, such as the reaction temperature, pressure, pulse and purge times, pulsing sequence and post deposition annealing can also be adjusted to achieve films with the desired properties.

In some embodiments, transition metal carbide thin films such as Al-doped TiC thin films are formed over a substrate in an ALD-type process by alternately and sequentially contacting the substrate with a transition metal compound, such as a transition metal halide, and a reactant comprising one or more TTBA isomers formed by vaporizing a precursor composition as described herein. In some embodiments an aluminum-doped titanium carbide film is formed on a substrate by an ALD-type process by alternately and sequentially contacting the substrate with a titanium compound, preferably a titanium halide, and a reactant comprising one or more TTBA isomers as described herein.

By using a reactant comprising one or more TTBA isomers and appropriate reaction conditions, a transition metal carbide film and in particular an Al-doped transition metal carbide thin films such as Al-doped TiC thin films with properties that are advantageous to a particular situation can be formed. For example, in some embodiments, a film with low resistivity is formed using a precursor composition as described herein. In some embodiments, metal carbide films, such as Al-doped titanium carbide films having a resistivity of about 4.60 eV to about 4.20 eV are deposited. In some embodiments, films with an aluminum concentration of about 1% to about 30%, more preferably about 6% to about 16% are deposited.

Compositions

In some embodiments, compositions comprising one or more TTBA isomers are provided that can be used for forming transition metal carbide films, and in particular Al-doped transition metal carbide thin films such as Al-doped titanium carbide thin films by vapor deposition processes such as ALD or CVD. The compositions can be vaporized such as by heating and the reactant vapor provided to a reaction space as discussed in more detail below. The vaporized composition may be referred to herein as a TTBA reactant. Although described primarily in terms of Al-doped transition metal carbide thin film deposition, such as titanium carbide and/or titanium aluminum carbide thin film deposition, other types of thin films may be deposited using the disclosed compositions.

Tritertbutyl aluminum (TTBA) has the formula $C_{12}H_{27}Al$ (IUPAC name—tris(2-methyl-2-propanyl)aluminum), and can be described as $Al((tert-Bu)_3)$. As mentioned above, TTBA has been found to spontaneously isomerize under certain conditions and therefore can be unstable during storage and use. For example, when stored for long periods (e.g., one year) at room temperature, or when stored for shorter periods (e.g., days or weeks) at higher temperatures (e.g., when subjected to heat over 60° C.) a TTBA composition may undergo isomerization such that the nature of the composition changes over time. TTBA degrades over time into a mixture of TTBA and one or more of its three isomers. The isomerization of TTBA into its three isomers is illustrated in the FIGURE. This isomerization can lead to variability over time in the quality of thin films deposited using a TTBA source.

As illustrated in the FIGURE, TTBA has at least three isomers, referred to herein as Isomer 1, Isomer 2 and Isomer 3. Isomer 1 (IUPAC name—bis(2-methyl-2-propanyl)-(2-methyl-1-propanyl)aluminum) has the formula $Al(tert-Bu)_2(iso-Bu)$, Isomer 2 (IUPAC name —(2-methyl-2-propanyl)-bis(2-methyl-1-propanyl)aluminum) has the formula $Al(tert-Bu)(iso-Bu)_2$ and Isomer 3 (IUPAC name—tris(2-methyl-1-propanyl)aluminum) has the formula $Al(iso-Bu)_3$. Without wishing to be held to any theory, it is believed that TTBA can isomerize to Isomer 1 at room temperature or at higher temperatures (e.g., 60° C.) and that isomerization of TTBA to Isomer 1 occurs relatively easily, whereas isomerization to Isomer 2 and Isomer 3 is relatively more difficult and progressively harder. For example, Isomer 1 is relatively stable at ≤50° C. and at ≤50° C. Isomer 1 does not significantly further isomerize into Isomer 2 and Isomer 3. However, Isomer 1 can isomerize to Isomer 2 at least at about 80° C.

Accordingly, a composition comprising a larger percentage of Isomer 1 can be more stable over time at typical temperatures used for storage and in vapor deposition reactors than compositions comprising a greater percentage of TTBA. Thus, in some embodiments, a precursor composition is provided comprising at least 50% Isomer 1, at least 70% Isomer 1, at least 80% Isomer 1, at least 90% Isomer 1, at least 95% Isomer 1 or at least 99% Isomer 1. As used herein, the recited percentage composition of the precursors is determined by percentage mass.

In some embodiments, a precursor composition comprises a mixture of TTBA and Isomer 1. In some embodiments, Isomer 1 makes up at least 50% of the TTBA precursor composition. In some embodiments Isomer 1 makes up at least 70% of the TTBA precursor composition. In some embodiments, Isomer 1 comprises at least 70, 75, 80, 85, 90, 91, 92, 93, 94 or 95% of the TTBA precursor composition.

In some embodiments the TTBA precursor composition does not comprise Isomer 2. In some embodiments the TTBA precursor composition does not comprise Isomer 3. In some embodiments the TTBA precursor composition may comprise at most about 5% Isomer 3.

In some embodiments a precursor composition comprising Isomer 1 does not comprise TTBA. In some such embodiments, an Isomer 1 precursor composition is provided in which Isomer 1 makes up at least 50% of the precursor composition. In some embodiments an Isomer 1 precursor composition is provided in which Isomer 1 makes up at least 70% of the precursor composition. In some embodiments, an Isomer 1 precursor composition is provided in which Isomer 1 comprises at least 70, 75, 80, 85, 90, 91, 92, 93, 94 or 95% of the precursor composition. In some embodiments the Isomer 1 precursor composition does not comprise Isomer 2. In some embodiments the Isomer 1 precursor composition does not comprise Isomer 3. In some embodiments the Isomer 1 precursor composition may comprise at most about 5% Isomer 3.

In some embodiments, a TTBA precursor composition may comprise Isomers 2 and/or 3 in addition to TTBA and Isomer 1. Thus, in some embodiments, a TTBA precursor composition comprises TTBA, Isomer 1 and may additionally comprise Isomer 2. For example, as disclosed herein a precursor composition may comprise TTBA and at least 20% of a combination of Isomer 1 and Isomer 2. In some embodiments, the TTBA precursor composition comprises TTBA, Isomer 1 and may additionally comprise Isomers 2 and 3. In some embodiments, the total amount of Isomer 2 and Isomer 3 in the composition is less than about 30%, less than about 20%, less than about 10%, less than about 5%, or less than about 1%.

In some embodiments, a precursor composition is provided comprising at least 50% Isomer 2, at least 70% Isomer 2, at least 80% Isomer 2, at least 90% Isomer 2, at least 95% Isomer 2 or at least 99% Isomer 2.

In some embodiments, a TTBA precursor composition comprises a mixture of TTBA and Isomer 2. In some embodiments, Isomer 2 makes up at least 50% of the TTBA precursor composition. In some embodiments Isomer 2 makes up at least 70% of the TTBA precursor composition. In some embodiments, Isomer 2 comprises at least 70, 75, 80, 85, 90, 91, 92, 93, 94 or 95% of the TTBA precursor composition.

In some embodiments a precursor composition comprising Isomer 2 does not comprise TTBA. In some such embodiments, an Isomer 2 precursor composition is provided in which Isomer 2 makes up at least 50% of the precursor composition. In some embodiments an Isomer 2 precursor composition is provided in which Isomer 2 makes up at least 70% of the precursor composition. In some embodiments, an Isomer 2 precursor composition is provided in which Isomer 2 comprises at least 70, 75, 80, 85, 90, 91, 92, 93, 94 or 95% of the precursor composition. In some embodiments the Isomer 2 precursor composition does not comprise Isomer 1. In some embodiments the Isomer 2 precursor composition does not comprise Isomer 3. In some embodiments the Isomer 2 precursor composition may comprise at most about 5% Isomer 3.

In some embodiments, a TTBA precursor composition may comprise Isomers 1 and/or 3 in addition to TTBA and Isomer 2. Thus, in some embodiments, a TTBA precursor composition comprises TTBA, Isomer 1 and may additionally comprise Isomer 2. In some embodiments, the TTBA precursor composition comprises TTBA, Isomer 2 and may additionally comprise Isomers 1 and 3. In some embodiments, the total amount of Isomer 1 and Isomer 3 in the composition is less than about 30%, less than about 20%, less than about 10%, less than about 5%, or less than about 1%.

In some embodiments, a precursor composition may comprise at least 20% of a combination of Isomer 1 and Isomer 2. That is, the percentage of Isomer 1 plus the percentage of Isomer 2 in the composition is greater than 20%. In some embodiments the precursor composition may comprise TTBA and at least 20% of a combination of Isomer 1 and Isomer 2. In some embodiments, a precursor composition may comprise at least 50% of a combination of Isomer 1 and Isomer 2. That is, the percentage of Isomer 1 plus the percentage of Isomer 2 in the composition is greater than 50%. In some embodiments a TTBA precursor may comprise TTBA and at least 50% of a combination of Isomer 1 and Isomer 2. In some embodiments, a precursor composition may comprise at least 80% of a combination of Isomer 1 and Isomer 2. That is, the percentage of Isomer 1 plus the percentage of Isomer 2 in the composition is greater than 80%. In some embodiments a TTBA precursor may comprise TTBA and at least 80% of a combination of Isomer 1 and Isomer 2. In some embodiments, a TTBA precursor composition comprises a combination of Isomer 1 and Isomer 2 and does not comprise Isomer 3.

In some embodiments, a precursor composition comprises a combination of Isomer 1 and Isomer 2 and a trace percentage of Isomer 3. For example, a precursor composition may comprise a combination of Isomer 1 and Isomer 2 and at most 5% Isomer 3. In some embodiments, a TTBA precursor comprises a combination of Isomer 1 and Isomer 2 and a trace percentage of TTBA. For example, a TTBA precursor may comprise a combination of Isomer 1 and Isomer 2 and at most 5% TTBA. In some embodiments a precursor composition may comprise a combination of Isomer 1 and Isomer 2, as described above, in addition to at most 5% TTBA and at most 5% Isomer 3.

The term "Isomer 1 precursor composition" is used herein to refer to a precursor composition comprising at least 50% Isomer 1. As discussed above, in some embodiments, an Isomer 1 precursor composition may contain more than 50% of Isomer 1, for example at least 70, 75, 80, 85, 90, 91, 92, 93, 94, 95, 98, 99 or 99.5% of Isomer 1. An Isomer 1 precursor composition can be vaporized for use in a vapor deposition process, and the vapor can be referred to as an "Isomer 1 reactant".

In some embodiments, an Isomer 1 precursor composition may comprise one or more additional components, for example TTBA, Isomer 2, Isomer 3 and/or contaminants. In some embodiments, the total amount of contaminants or minor components is less than about 1% of the precursor composition. In some embodiments an Isomer 1 precursor composition contains at least a trace amount of TTBA, up to at most 5%. In some embodiments an Isomer 1 precursor composition contains at least a trace amount of Isomer 3, up to at most 5%.

The term "Isomer 2 precursor composition" is used herein to refer to a precursor composition comprising at least 50% Isomer 2. As discussed above, in some embodiments, an Isomer 1 precursor composition may contain more than 50% of Isomer 2, for example at least 70, 75, 80, 85, 90, 91, 92, 93, 94, 95, 98, 99 or 99.5% of Isomer 2. An Isomer 2 precursor composition can be vaporized for use in a vapor deposition process, and the vapor can be referred to as an "Isomer 2 reactant".

In some embodiments, an Isomer 2 precursor composition may comprise one or more additional components, for example TTBA, Isomer 1, Isomer 3 and/or contaminants. In some embodiments, the total amount of contaminants or minor components is less than about 1% of the precursor composition. In some embodiments an Isomer 2 precursor composition contains at least a trace amount of TTBA, up to at most 5%. In some embodiments an Isomer 2 precursor composition contains at least a trace amount of Isomer 3, up to at most 5%.

The term "Isomer 1 and 2 precursor composition" is used herein to refer to a precursor composition comprising at least 20% of a combination of Isomer 1 and Isomer 2. That is, the percentage of Isomer 1 plus the percentage of Isomer 2 in the composition is greater than 20%. In some embodiments, an Isomer 1 and 2 precursor composition may contain more than about 20% of a combination of Isomer 1 and 2, more than about 30% of a combination of Isomer 1 and Isomer 2, more than about 40% of a combination of Isomer 1 and 2, or even more than about 50% of a combination of Isomer 1 and Isomer 2, for example at least 70, 75, 80, 85, 90, 91, 92, 93, 94, 95, 98, 99 or 99.5% of a combination of Isomer 1 and Isomer 2. An Isomer 1 and 2 precursor composition can be vaporized for use in a vapor deposition process, and the vapor can be referred to as an "Isomer 1 and 2 reactant".

In some embodiments, an Isomer 1 and 2 precursor composition may comprise one or more additional components, for example TTBA, Isomer 3 and/or contaminants. In some embodiments, the total amount of contaminants or minor components is less than about 1% of the precursor composition. In some embodiments an Isomer 1 and 2 precursor composition contains at least a trace amount of TTBA, up to at most 5%. In some embodiments an Isomer 1 and 2 precursor composition contains at least a trace amount of Isomer 3, up to at most 5%.

In some embodiments, an Isomer 1 precursor composition can be prepared by heating a composition consisting essentially of TTBA until a desired amount of Isomer 1 has formed in the composition. In some embodiments, the composition is heated to form an Isomer 1 precursor composition. For example, it can be heated until the composition comprises at least 50% Isomer 1. In some embodiments, the composition is heated at a temperature of about room temperature to about 100° C., preferably about 50° C. to about 80° C., more preferably at about 60° C. Isomer 1 may subsequently be purified to obtain an Isomer 1 precursor composition comprising at least about 90%, at least about 95%, at least about 99%, or even at least about 99.5% Isomer 1. In some embodiments, the precursor composition is heated at a temperature of ≤50° C. until an Isomer 1 precursor composition comprising at least about 50%, at least about 60%, at least about 70%, at least about 80%, at least about 90%, at least about 95%, at least about 99%, or even at least about 99.5% Isomer 1 is obtained.

In some embodiments, an Isomer 2 precursor composition can be prepared by heating a composition consisting essentially of TTBA until a desired amount of Isomer 2 has formed in the composition. In some embodiments, the composition is heated until it forms an Isomer 2 precursor composition, for example by forming greater than 50% Isomer 2. In some embodiments, the composition is heated at a temperature of about room temperature to about 100° C., preferably about 50° C. to about 80° C., more preferably at about 60° C. Isomer 2 may subsequently be purified to obtain an Isomer 2 precursor composition comprising at least about 90%, at least about 95%, at least about 99%, or even at least about 99.5% Isomer 2. In some embodiments, the precursor composition is heated at a temperature of ≤50° C. until an Isomer 2 precursor composition comprising at least about 50%, at least about 60%, at least about 70%, at least about 80%, at least about 90%, at least about 95%, at least about 99%, or even at least about 99.5% Isomer 2 is obtained.

In some embodiments, an Isomer 1 and 2 precursor composition can be prepared by heating a composition consisting essentially of TTBA until a desired amount of Isomer 1 and 2 has formed in the composition. In some embodiments, the composition is heated until it comprises at least about 20% of a combination of Isomer 1 and 2, thereby forming an Isomer 1 and 2 precursor composition. In some embodiments, a TTBA composition is heated at a temperature of about room temperature to about 100° C., preferably about 50° C. to about 80° C., more preferably at about 60° C. Isomer 1 and 2 may subsequently be purified to obtain an Isomer 1 and 2 precursor composition comprising at least about 90%, at least about 95%, at least about 99%, or even at least about 99.5% of a combination of Isomer 1 and Isomer 2. In some embodiments, the TTBA precursor composition is heated at a temperature of ≤50° C. until an Isomer 1 and 2 precursor composition comprising at least about 20%, at least about 30%, at least about 40%, at least about 50%, at least about 60%, at least about 70%, at least about 80%, at least about 90%, at least about 95%, at least about 99%, or even at least about 99.5% of a combination of Isomer 1 and Isomer 2 is obtained. In some embodiments an Isomer 1 and 2 precursor composition is prepared by combining Isomer 1 and Isomer 2 compositions.

In some embodiments, a container containing an Isomer 1, Isomer 2 or Isomer 1 and 2 precursor composition is provided. The container may be configured to be utilized as a precursor source for a vapor deposition reactor. For example, the container may be configured to be fluidly attached to a vapor deposition reactor.

In some embodiments, the container is stored at about 80° C. or less, more preferably about 50° C. or less, more preferably 25° C. or less, in order to maintain the desired amount of Isomer 1 and/or Isomer 2 in the composition. In some embodiments, the desired amount is at least about 50% Isomer 1, for example at least about 50, 60, 70, 75, 80, 85, 90, 91, 92, 93, 94, 95, 98, 99 or 99.5% Isomer 1. In some embodiments, the desired amount is at least about 50% Isomer 2, for example at least about 50, 60, 70, 75, 80, 85, 90, 91, 92, 93, 94, 95, 98, 99 or 99.5% Isomer 2. In some embodiments the desired amount is at least about 20% of a combination of Isomer 1 and Isomer 2.

In some embodiments, the precursor composition in the container comprises at least 20% of a combination of Isomer 1 and Isomer 2. In some embodiments, the precursor composition in the container comprises at least 50% of a combination of Isomer 1 and Isomer 2. In some embodiments, the precursor composition in the container comprises at least 80% of a combination of Isomer 1 and Isomer 2. In some embodiments, the precursor composition in the container comprises a combination of Isomer 1 and Isomer 2 and does not comprise Isomer 3, or comprises a trace amount of Isomer 3. In some embodiments, the precursor composition in the container comprises a combination of Isomer 1 and Isomer 2 and at most 5% Isomer 3. In some embodiments the precursor composition in the container comprises a combination of Isomer 1 and Isomer 2 and does not comprise TTBA or comprises a trace amount of TTBA. In some embodiments the precursor composition comprises a combination of Isomer 1 and Isomer 2 and at most 5% Isomer 3.

In some embodiments, a vapor deposition reactor is provided comprising a container containing an Isomer 1, Isomer 2 or Isomer 1 and 2 precursor composition. In some embodiments, the container contains a composition comprising at least about 50% Isomer 1 or at least about 50% Isomer 2. In some embodiments, the container contains a composition comprising at least about 70% Isomer 1 or at least about 70% Isomer 2. In some embodiments the container contains an Isomer 1 precursor composition comprising at least about 70%, at least about 80%, at least about 90%, at least about 95%, at least about 99%, or even at least about 99.5% Isomer 1. In some embodiments the container contains an Isomer 2 precursor composition comprising at least about 50% Isomer 2. In some embodiments the container contains an Isomer 2 precursor composition comprising at least about 70%, at least about 80%, at least about 90%, at least about 95%, at least about 99%, or even at least about 99.5% Isomer 2. In some embodiments the container contains an Isomer 1 and 2 precursor composition comprising at least about 20% of a combination of Isomer 1 and 2, as described herein.

In some embodiments, the deposition reactor is configured to vaporize the Isomer 1, Isomer 2 or Isomer 1 and 2 composition for depositing an Al-doped transition metal carbide thin film on a substrate in a reaction space in the reactor. The reactor may be further configured to transport the vaporized Isomer 1, Isomer 2 or Isomer 1 and 2 composition to the reaction space. In some embodiments the reactor may comprise controls set to provide a desired quantity of the vaporized Isomer 1, Isomer 2 or Isomer 1 and 2 composition to the reaction space at desired intervals and for the desired amount of time.

In some embodiments, a vapor deposition reactor is also provided with a container containing an metal precursor composition, such as a titanium precursor composition. For example, a container may comprise a titanium halide precursor. The deposition reactor may be configured to vaporize the metal precursor and transport the vaporized precursor to the reaction space. Controls may be provided that are set to provide a desired quantity of the vaporized metal precursor to the reaction space at a desired interval and for a desired amount of time.

Exemplary Deposition Methods

In some embodiments, a transition metal carbide thin film, for example an aluminum-doped transition metal carbide thin film such as an Al-doped titanium carbide film is deposited by vapor deposition using a TTBA composition as disclosed herein, such as an Isomer 1, Isomer 2 or Isomer 1 and 2 composition. However, the disclosed compositions can be used in any context in which an aluminum hydrocarbon compound may be desirable, and in particular may be used in any vapor depositions in which an aluminum hydrocarbon compound may be suitable. Exemplary ALD and CVD processes are outlined generally below. However, other vapor deposition processes in which the TTBA compositions and in particular the Isomer 1, Isomer 2 or Isomer 1 and 2 compositions can be used will be apparent to the skilled artisan.

Thus, in some embodiments, transition metal carbide thin films, for example aluminum-doped transition metal carbide films such as Al-doped titanium carbide thin films can be deposited on a substrate using a an Isomer 1, Isomer 2 or Isomer 1 and 2 composition. In some embodiments, one or more transition metal halides can be used as the transition metal source. In some embodiments a titanium halide precursor can be used as a titanium source to form titanium carbide films. In some embodiments, an Isomer 1, Isomer 2 or Isomer 1 and 2 composition is vaporized to form an Isomer 1, Isomer 2 or Isomer 1 and 2 reactant that is provided to a reaction space comprising a substrate on which a titanium carbide film is to be deposited. The substrate is also contacted with a vapor phase transition metal reactant, such as a transition metal halide. In some embodiments the transition metal halide reactant is a titanium halide reactant. In some embodiments the metal halide reactant comprises a transition metal such as niobium or vanadium. The thin film can be an Al-doped transition metal carbide thin film and in some embodiments is a titanium carbide thin film and may be an Al-doped titanium carbide thin film (e.g., TiC or TiAlC thin film).

In some embodiments, the process of depositing a transition metal carbide thin film such as an Al-doped titanium carbide thin film can be a chemical vapor deposition (CVD) process in which a substrate is simultaneously contacted with an Isomer 1, Isomer 2 or Isomer 1 and 2 reactant and a transition metal reactant, for example a transition metal halide such as a titanium halide reactant. In some embodiments, the process of depositing a transition metal carbide thin film such as an Al-doped titanium carbide thin film can be an atomic layer deposition (ALD) process in which a substrate is alternately and sequentially contacted with an Isomer 1, Isomer 2 or Isomer 1 and 2 reactant, formed by vaporizing an Isomer 1, Isomer 2 or Isomer 1 and 2 precursor composition, and a vapor phase transition metal reactant, such a transition metal halide. In some embodiments the transition metal halide reactant is a titanium halide reactant, such as $TiCl_4$.

Exemplary ALD Methods

ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an adsorbed layer of one reactant leaves a surface termination that is non-reactive with the gas phase reactants of the same reactant. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example if some gas phase reactions occur despite the alternating nature of the process.

In a typical ALD-type process for depositing metal carbide films, one deposition cycle comprises exposing the substrate to a first reactant, removing any unreacted first reactant and reaction byproducts from the reaction space, exposing the substrate to a second reactant, followed by a second removal step. The first reactant is preferably a metal precursor, in particular a transition metal precursor, such as a titanium precursor, and the second reactant is preferably a carburizing (or carbon-contributing) compound, such as the TTBA compositions described herein (although it is possible to begin the process with either reactant).

The transition metal compound may comprise one or more transition metals selected from the group consisting of, but not limited to, scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd) and mercury (Hg). However, as titanium carbide films are exemplified herein, in such embodiments, the metal compound comprises titanium.

Typically, transition metal halide reactants, such as, e.g., $TiCl_4$, are used as metal precursors in ALD deposition.

A TTBA precursor composition is used as the aluminum reactant source. In particular, in some embodiments, an Isomer 1 precursor composition is used. As discussed above, an Isomer 1 precursor composition may comprise, for example, about 50%, 60%, 70%, 80%, 90%, 95%, 99% or more of Isomer 1. The Isomer 1 precursor composition may be provided in a container attached to the deposition reactor. The composition is vaporized and the Isomer 1 reactant vapor is provided to a reaction space comprising the substrate.

In some embodiments, an Isomer 2 precursor composition is used. As discussed above, an Isomer 2 precursor composition may comprise, for example, about 50%, 60%, 70%, 80%, 90%, 95%, 99% or more Isomer 2. The Isomer 2 precursor composition may be provided in a container attached to the deposition reactor. The composition is vaporized and the Isomer 2 reactant vapor is provided to a reaction space comprising the substrate.

In some embodiments, an Isomer 1 and Isomer 2 precursor composition is used. As discussed above, a combination of Isomer 1 and Isomer 2 precursor composition may comprise at least 20%, at least 50%, or at least 80% of a combination of Isomer 1 and Isomer 2 or only a combination of Isomer 1 and Isomer 2 and not Isomer 3. The Isomer 1 and 2 precursor composition may be provided in a container attached to the deposition reactor. The composition is vaporized and the combination of Isomer 1 and 2 reactant vapor is provided to a reaction space comprising the substrate.

Precursors may be separated by inert gases, such as Ar, to prevent gas-phase reactions between reactants and enable self-saturating surface reactions. In some embodiments, however, the substrate may be moved to separately contact a first metal reactant and a second Isomer 1, Isomer 2 or Isomer 1 and 2 reactant. Because the reactions self-saturate, strict temperature control of the substrates and precise dosage control of the precursors is not usually required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

According to some embodiments, ALD-type processes are used to form transition metal carbide thin films, for example Al-doped transition metal carbide thin films, such as Al-doped titanium carbide thin films on a substrate, such as an integrated circuit workpiece. Preferably, each ALD cycle comprises two distinct deposition steps or phases. In a first phase of the deposition cycle ("the metal phase"), the substrate surface on which deposition is desired is contacted with a first reactant comprising a transition metal such as titanium (i.e., titanium source material or chemical) which chemisorbs onto the substrate surface, forming no more than about one monolayer of reactant species on the surface of the substrate.

In some embodiments, the transition metal (e.g., titanium) source chemical, also referred to herein as the "transition metal compound" (or in some embodiments as the "titanium compound"), is a halide and the adsorbed monolayer is terminated with halogen ligands. In some embodiments, the titanium halide is $TiCl_4$.

Excess transition metal (e.g., titanium) source material and reaction byproducts (if any) are removed from the substrate surface, e.g., by purging with an inert gas. Excess transition metal source material and any reaction byproducts may be removed with the aid of a vacuum generated by a pumping system.

In a second phase of the deposition cycle ("carbon-contributing phase"), the substrate is contacted with a second Isomer 1, Isomer 2 or Isomer 1 and 2 reactant, which reacts with the titanium-containing molecules left on the substrate surface. Preferably, in the second phase carbon is incorporated into the film by the interaction of the second Isomer 1, Isomer 2 or Isomer 1 and 2 reactant with the monolayer left by the transition metal (e.g., titanium) source material. In some embodiments, reaction between the second Isomer 1, Isomer 2 or Isomer 1 and 2 reactant and the chemisorbed transition metal species produces a transition metal carbide thin film over the substrate, in some embodiments, an Al-doped transition metal carbide thin film. In some embodiments, reaction between the second Isomer 1, Isomer 2 or Isomer 1 and 2 reactant and the chemisorbed titanium species produces an Al-doped titanium carbide thin film over the substrate.

Aluminum may be incorporated into the film in this second phase. In some embodiments, the aluminum content may vary from about 1% to about 30%, more preferably from about 6% to about 16%. In other embodiments, the aluminum content may be higher.

Excess second source chemical and reaction byproducts, if any, are removed from the substrate surface, for example by a purging gas pulse and/or vacuum generated by a pumping system. Purging gas is preferably any inert gas, such as, without limitation, argon (Ar) or helium (He). A phase is generally considered to immediately follow another phase if a purge (i.e., purging gas pulse) or other reactant removal step intervenes.

In some embodiments, the thin film deposition process is carried out at a temperature of less than about 500° C. In other embodiments, the deposition process is carried out at a temperature of between about 300° C. to about 400° C. In other embodiments, the deposition process is carried out at a temperature of about 300-350° C.

In some embodiments, the eWF of films deposited by ALD using an Isomer 1 reactant and a metal halide, for example a titanium halide such as $TiCl_4$, can range from about 4.60 eV to about 4.30 eV. In some embodiments, the resistivity of such films can range from about 4.50 eV to about 4.20 eV.

The deposition rate of the thin film by ALD, which is typically presented as Å/pulsing cycle, depends on a number of factors including, for example, on the number of available reactive surface sites or active sites on the surface and bulkiness of the chemisorbing molecules. In some embodiments, the deposition rate of such films may range from about 0.5 to about 5.0 Å/pulsing cycle. In some embodiments, the deposition rate can be about 0.5, 1.0, 1.5, 2.0, 2.5, 3.0, 3.5, 4.0, 4.5, 5.0 Å/pulsing cycle.

The transition metal carbide thin films, such as Al-doped transition metal carbide thin film and in particular Al-doped titanium carbide thin films formed by the processes disclosed herein can be utilized in a variety of contexts, such as in the formation of electrode structures. One of skill in the art will recognize that the processes described herein are applicable to many contexts, including fabrication of NMOS transistors including planar devices as well as multiple gate transistors, such as FinFETs.

What is claimed is:

1. A deposition reactor comprising a first reactant container fluidly connected to a reaction chamber, the reactant container comprising a first precursor composition comprising at least 50% Isomer 1, at least 50% Isomer 2, or at least 20% of a combination of Isomer 1 and Isomer 2 of Al(tert-Bu)$_3$, wherein Isomer 1 has the formula Al(tert-Bu)$_2$(iso-Bu) and Isomer 2 has the formula Al(tert-Bu)(iso-Bu)$_2$.

2. The deposition reactor of claim 1, wherein the composition comprises at least 70% Isomer 1.

3. The deposition reactor of claim 1, wherein the composition comprises at least 70% Isomer 2.

4. The deposition reactor of claim 1, wherein the composition comprises at least 50% of a combination of Isomer 1 and Isomer 2.

5. The deposition reactor of claim 1, wherein the composition comprises at least 80% of a combination of Isomer 1 and Isomer 2.

6. The deposition reactor of claim 1, wherein the composition does not comprise Isomer 3, wherein Isomer 3 has the formula Al(iso-Bu)$_3$.

7. The deposition reactor of claim 1, where in the composition comprises at most 5% Isomer 3, wherein Isomer 3 has the formula Al(iso-Bu)$_3$.

8. The deposition reactor of claim 1, wherein the composition additionally comprises Isomer 3 of Al(tert-Bu)$_3$, wherein Isomer 3 has the formula Al(iso-Bu)$_3$.

9. The deposition reactor of claim 1, wherein the deposition reactor is configured to vaporize the first precursor composition and conduct the vapor to the reaction chamber.

10. The deposition reactor of claim 1, comprising a second reactant container, the second container comprising a titanium halide precursor composition.

* * * * *